United States Patent
Nikitin et al.

(10) Patent No.: US 11,598,904 B2
(45) Date of Patent: Mar. 7, 2023

(54) POWER SEMICONDUCTOR MODULE AND METHOD FOR PRODUCING A POWER SEMICONDUCTOR MODULE

(71) Applicant: Infineon Technologies AG, Neubiberg (DE)

(72) Inventors: Ivan Nikitin, Regensburg (DE); Dirk Ahlers, Munich (DE); Andreas Grassmann, Regensburg (DE); Andre Uhlemann, Wickede (DE)

(73) Assignee: Infineon Technologies AG, Neubiberg (DE)

( * ) Notice: Subject to any disclaimer, the term of this patent is extended or adjusted under 35 U.S.C. 154(b) by 252 days.

(21) Appl. No.: 16/704,873

(22) Filed: Dec. 5, 2019

(65) Prior Publication Data

US 2020/0183056 A1 Jun. 11, 2020

(30) Foreign Application Priority Data

Dec. 11, 2018 (DE) .......................... 102018131735.2
Nov. 4, 2019 (DE) .......................... 102019129675.7

(51) Int. Cl.
*G02B 1/118* (2015.01)
*H05K 3/40* (2006.01)
*H01L 23/31* (2006.01)
*H01L 23/00* (2006.01)
*H05K 1/05* (2006.01)
*H01L 23/28* (2006.01)
*H05K 1/18* (2006.01)
(Continued)

(52) U.S. Cl.
CPC .............. *G02B 1/118* (2013.01); *H01L 23/28* (2013.01); *H01L 23/31* (2013.01); *H01L 24/83* (2013.01); *H05K 1/0204* (2013.01); *H05K 1/053* (2013.01); *H05K 1/185* (2013.01); *H05K 3/0061* (2013.01); *H05K 3/40* (2013.01)

(58) Field of Classification Search
CPC ......... H01L 24/83; H01L 23/31; H01L 23/28; H05K 3/40; H05K 3/0061; H05K 1/185; H05K 1/053; H05K 1/0204
See application file for complete search history.

(56) References Cited

U.S. PATENT DOCUMENTS

| | | | |
|---|---|---|---|
| 4,625,228 | A | 11/1986 | Bischoff et al. |
| 5,504,372 | A | 4/1996 | Braden et al. |
| 2005/0012183 | A1 | 1/2005 | Chow et al. |

(Continued)

FOREIGN PATENT DOCUMENTS

| CN | 105470378 A | 4/2016 |
|---|---|---|
| DE | 19828190 A1 | 9/1999 |

(Continued)

*Primary Examiner* — Syed I Gheyas
(74) *Attorney, Agent, or Firm* — Murphy, Bilak & Homiller, PLLC

(57) ABSTRACT

A power semiconductor module includes a first substrate, wherein the first substrate includes aluminum, a first aluminum oxide layer arranged on the first substrate, a conductive layer arranged on the first aluminum oxide layer, a first semiconductor chip, wherein the first semiconductor chip is arranged on the conductive layer and is electrically connected thereto, and an electrical insulation material enclosing the first semiconductor chip, wherein the first aluminum oxide layer is configured to electrically insulate the first semiconductor chip from the first substrate.

5 Claims, 6 Drawing Sheets

(51) Int. Cl.
*H05K 1/02* (2006.01)
*H05K 3/00* (2006.01)

(56) References Cited

U.S. PATENT DOCUMENTS

| | | |
|---|---|---|
| 2005/0067186 A1 | 3/2005 | Mizutani et al. |
| 2007/0139864 A1* | 6/2007 | Dunn ........................ H01G 9/15 361/523 |
| 2009/0039498 A1* | 2/2009 | Bayerer .............. H01L 23/3735 257/E23.173 |
| 2009/0206456 A1* | 8/2009 | Guth ........................ H01L 24/83 257/E23.04 |
| 2012/0106086 A1* | 5/2012 | Schloerke ................ H01L 23/24 361/715 |
| 2012/0106109 A1 | 5/2012 | Kim et al. |
| 2012/0248592 A1 | 10/2012 | Hata et al. |

FOREIGN PATENT DOCUMENTS

| | | |
|---|---|---|
| DE | 10042839 A1 | 4/2002 |
| DE | 60113337 T2 | 6/2006 |
| DE | 102011108198 A1 | 3/2012 |
| DE | 102012213407 A1 | 2/2013 |
| DE | 102014105000 A1 | 10/2015 |
| DE | 102015110535 A1 | 1/2016 |
| EP | 0731505 A2 | 9/1996 |
| KR | 20110029829 A | 3/2011 |

* cited by examiner

POWER SEMICONDUCTOR MODULE AND METHOD FOR PRODUCING A POWER SEMICONDUCTOR MODULE

TECHNICAL FIELD

The present disclosure relates to a power semiconductor module and a method for producing a power semiconductor module.

BACKGROUND

Power semiconductor modules, that is to say semiconductor modules designed to be operated with a high current and/or a high voltage, can be differentiated in terms of the construction and connection techniques used. One possibility is to embed substrate(s), semiconductor chip(s) and possible further components of the module in an electrical insulation body. It may be of crucial importance here for individual components of the power semiconductor module, e.g. power region, logic/control region, power semiconductor chip, and heat sink, to be electrically insulated from one another. This can be done by providing electrical insulation layers. Electrical insulation layers which satisfy specific requirements in respect of breakdown strength or thermal conductivity can be used in improved power semiconductor modules and/or improved production methods for power semiconductor modules.

The stated problem addressed by the invention is solved by the features of the independent patent claims. Advantageous configurations and developments of the invention are specified in the dependent claims.

SUMMARY

Individual examples relate to a power semiconductor module comprising a first substrate, wherein the first substrate comprises aluminum, a first aluminum oxide layer arranged on the first substrate, a conductive layer arranged on the first aluminum oxide layer, a first semiconductor chip, wherein the first semiconductor chip is arranged on the conductive layer and is electrically connected thereto, and an electrical insulation material enclosing the first semiconductor chip, wherein the first aluminum oxide layer is configured to electrically insulate the first semiconductor chip from the first substrate.

Individual examples relate to a power semiconductor module comprising an aluminum substrate comprising a housing of the power semiconductor module and/or a heat sink, an aluminum oxide layer arranged on the aluminum substrate, and a printed circuit board arranged above the aluminum oxide layer, wherein a power semiconductor chip is embedded into the printed circuit board, and wherein the aluminum oxide layer is configured to electrically insulate the power semiconductor chip from the aluminum substrate.

Individual examples relate to a method for producing a power semiconductor module, the method comprising providing a first substrate, wherein the first substrate comprises aluminum, anodizing the first substrate in order to produce a first aluminum oxide layer forming a conductive layer on the first aluminum oxide layer, arranging a first semiconductor chip on the conductive layer and electrically connecting it thereto, and encapsulating the first semiconductor chip in an electrical insulation body, wherein the first aluminum oxide layer is configured to electrically insulate the first semiconductor chip from the first substrate.

Individual examples relate to a method for producing a power semiconductor module, the method comprising providing an aluminum substrate comprising one or more of a housing of the power semiconductor module and a heat sink, anodizing the aluminum substrate in order to produce an aluminum oxide layer, and arranging a printed circuit board above the aluminum oxide layer, wherein a power semiconductor chip is embedded into the printed circuit board, and wherein the aluminum oxide layer is configured to electrically insulate the power semiconductor chip from the aluminum substrate.

Individual examples relate to a power semiconductor module, comprising a substrate, wherein the substrate is electrically conductive and has a first side and an opposite second side, a semiconductor chip arranged on the first side of the substrate, wherein the semiconductor chip is electrically connected to the substrate, an electrical insulation material enclosing the semiconductor chip, and an oxide layer arranged at least on the second side of the substrate.

BRIEF DESCRIPTION OF THE DRAWINGS

The accompanying drawings illustrate examples and together with the description serve to elucidate the principles of the disclosure. The elements of the drawings are not necessarily true to scale with respect to one another. Identical reference signs may designate mutually corresponding, similar or identical parts.

DETAILED DESCRIPTION

Power semiconductor modules which can contain one or more semiconductor chips are described above. The semiconductor chips can be of various types, be produced by various technologies and comprise for example integrated electrical circuits and/or passive elements. The semiconductor chips can be designed for example as power semiconductor chips, such as, for instance, power MOSFETs (metal oxide semiconductor field effect transistors), IGBTs (insulated gate bipolar transistors), JFETs (junction field effect transistors), power bipolar transistors or power diodes. Furthermore, the semiconductor chips can comprise control circuits or microprocessors. In one embodiment, semiconductor chips having a vertical structure can occur, that is to say that the semiconductor chips can be produced such that electric currents can flow in a direction perpendicular to the main surfaces of the semiconductor chips. In one embodiment, a semiconductor chip having a vertical structure can have contact elements on its two main surfaces, that is to say on its top side and its underside. By way of example, the source electrode and gate electrode of a power MOSFET can be situated on one main surface, while the drain electrode of the power MOSFET is arranged on the other main surface. The semiconductor chips can be produced from a specific semiconductor material, such as, for instance, Si, SiC, SiGe, GaAs or GaN, and can furthermore contain inorganic and/or organic materials that are not semiconductors, such as, for example, insulators, plastics or metals. Furthermore, the semiconductor chips can be encapsulated or unencapsulated.

Figure 1A:
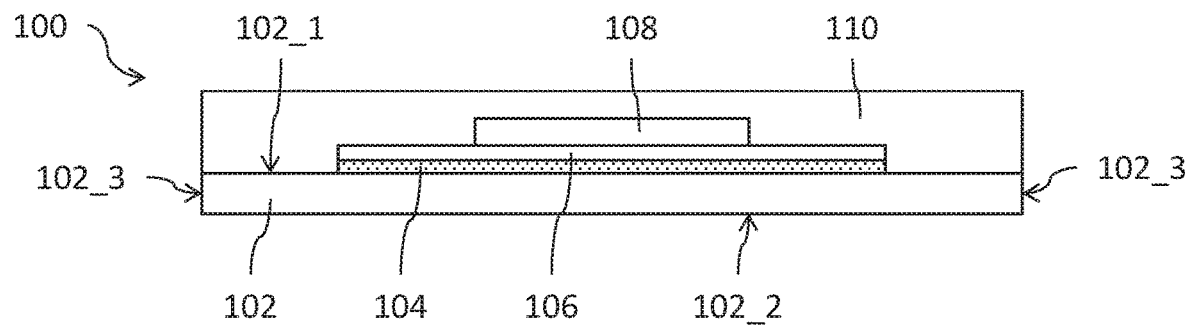
FIGS. 1A and 1B show schematic cross-sectional views of power semiconductor modules.

FIG. 1A shows a cross-sectional view of a power semiconductor module 100 comprising a first substrate 102, a first aluminum oxide layer ($Al_2O_3$ layer) 104 arranged on the first substrate 102, a conductive layer 106 arranged on the first aluminum oxide layer 104, and a first semiconductor chip 108. The first semiconductor chip 108 is arranged on the conductive layer 106 and is electrically connected thereto. Furthermore, the power semiconductor module 100 comprises an electrical insulation material 110 enclosing the first semiconductor chip 108. The first aluminum oxide layer 104 is configured to electrically insulate the first semiconductor chip 108 from the first substrate 102.

The first substrate 102 can consist wholly or at least partly of aluminum. The first substrate 102 can be part of a leadframe or it can also comprise a layer structure of alternating electrically conductive and insulating layers, that is to say it can be e.g. a DAB substrate (DAB—direct aluminum bonded). The first substrate 102 can be a chip pad, that is to say that it is configured to carry a semiconductor chip. The first substrate 102 can be electrically connected to the first semiconductor chip 108 or it can also be electrically insulated from the first semiconductor chip 108. The first substrate 102 can be at least partly exposed at the electrical insulation material 110 and it can have one or more external terminals configured for electrically contacting the first semiconductor chip 108.

The first aluminum oxide layer 104 can be arranged directly on the first substrate 102. The first aluminum oxide layer 104 can wholly or at least partly cover the first substrate 102. The first aluminum oxide layer 104 can cover e.g. (exclusively) an upper surface 102_1 of the first substrate 102. The remaining surfaces of the first substrate 102 can be free of the first aluminum oxide layer 104. The first aluminum oxide layer 104 can wholly or partly cover the upper surface 102_1; e.g. a large part of the upper surface 102_1 can be covered by the first aluminum oxide layer 104. Those surfaces of the first substrate 102 which are not covered by the first aluminum oxide layer 104 can be covered by a second aluminum oxide layer (not shown in FIG. 1A). The second aluminum oxide layer can be a native aluminum oxide layer, that is to say that it can have been formed by the first substrate 102 having been exposed to the surrounding air.

The first aluminum oxide layer 104 can have a thickness that is greater than a thickness of a native aluminum oxide layer of the first substrate 102. The thickness of the first aluminum oxide layer 104 can be e.g. more than 400 nm, more than 600 nm, more than 800 nm, more than 1 μm, or else more than 2 μm, and e.g. between 1 μm and 20 μm. The thickness of a native aluminum oxide layer, by contrast, can be much less than 1 μm and be e.g. just approximately 200 nm. The thickness of the aluminum oxide layer 104 can be e.g. greater than a thickness of the conductive layer 106 and e.g. less than a thickness of the first substrate 102.

The first aluminum oxide layer 104 can be an anodized layer, that is to say that it can be formed by electrolytic oxidation of aluminum. A customary anodization method can be used for forming the first aluminum oxide layer 104. Forming the first aluminum oxide layer 104 can include thickening a native aluminum oxide layer of the first substrate 102, e.g. by means of an anodization method.

The first aluminum oxide layer 104 can be an electrical insulation layer and can be configured to electrically insulate the conductive layer 106 above the first aluminum oxide layer 104 from the first substrate 102 below the first aluminum oxide layer, in particular up to a voltage difference of approximately 1 kV or even 2 kV or more.

The conductive layer 106 can be arranged directly on the first aluminum oxide layer 104. The conductive layer 106 can be a metallization layer and can be a single ply or a layer stack of (different) metal layers. The conductive layer 106 can be produced e.g. by means of a deposition method. The conductive layer 106 can comprise e.g. Ag, Al, Au, or Cu or a metal alloy.

The conductive layer 106 can be a redistribution layer of the power semiconductor module 100 and it can comprise a multiplicity of conductor tracks. The conductive layer 106 can be configured to provide electrical connections between various electrical or electronic components arranged on the conductive layer 106, such as the first semiconductor chip 108 or else passive components such as resistors or capacitors. Electrical and/or electronic components arranged on the conductive layer 106, such as the first semiconductor chip 108, can be part of a logic/control region or low-voltage circuit of the power semiconductor module 100. The logic/control region can be designed e.g. for an operating voltage of not more than 48V.

The first semiconductor chip 108 can be e.g. a control chip or a driver chip designed to control a power semiconductor chip of the power semiconductor module 100. The first semiconductor chip 108 can be connected to the conductive layer 106 by means of a suitable connection technology, e.g. by means of a sintering connection. In particular, it is possible to use such a connection technology which allows the first semiconductor chip 108 to be connected to the conductive layer 106 at low temperatures, e.g. at temperatures of less than approximately 250° C. A low processing temperature can be important for the reason that the first aluminum oxide layer 104 can be temperature-sensitive. An excessively high temperature can result in the first aluminum oxide layer 104 being damaged and thus no longer electrically insulating the conductive layer 106 from the first substrate 102.

The electrical insulation material 110 can be configured to encapsulate the first semiconductor chip 108 and possible further electrical or electronic components of the power semiconductor module 100. The electrical insulation material 110 can be e.g. a potting material or a laminate and can comprise a polymer. In accordance with one example, the electrical insulation material 110 is an encapsulation body.

The first substrate 102 can be at least partly exposed at the electrical insulation material 110. By way of example, the electrical insulation material 110 can be arranged only at the upper surface 102_1 of the first substrate 102, while an opposite lower surface 102_2 and possibly also side surfaces 102_3 are not covered by the electrical insulation material 110.

The arrangement of the conductive layer 106 on the first aluminum oxide layer 104 serving as an electrical insulation layer can afford the advantage that the conductive layer 106 can be structured significantly more finely than would be possible with the first substrate 102 (e.g. by means of a DAB etching technique). Therefore, the fine structures (e.g. conductor tracks) desired for the logic/control region of the power semiconductor module 100 can be produced in the conductive layer 106, while this would not be possible in the first substrate 102 itself.

Figure 1B:
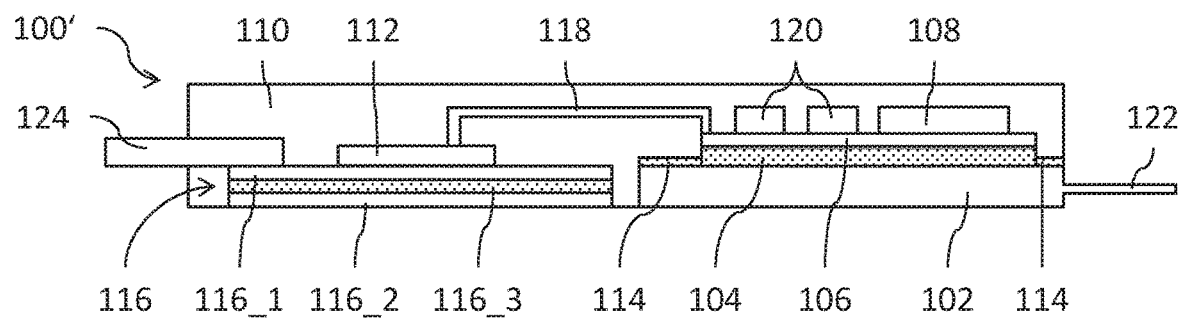

FIG. 1B shows a cross-sectional view of a power semiconductor module 100', which can be identical or at least similar to the power semiconductor module 100. The power semiconductor module 100' can comprise all components described with regard to the power semiconductor module 100 and additionally the components described below.

The power semiconductor module 100' comprises the first substrate 102 and it additionally comprises a second substrate 116, which is different than the first substrate 102. The second substrate 116 can comprise an upper and a lower metal layer 116_1, 116_2 and also an electrical insulation layer 116_3 embedded into said metal layers. The second substrate 116 can be arranged laterally next to the first substrate 102 and at a defined distance therefrom. The lower surface 102_2 of the first substrate 102 and the lower metal layer 116_2 can be coplanar and they can be exposed at the electrical insulation material 110. The second substrate 116 can be e.g. a substrate of the DAB type. The electrical insulation material 110 can be arranged in a gap between the first and second substrates 102, 116. The first substrate 102 and the second substrate 116 can have the same or a different height (or thickness). The case where both substrates 102, 116 have the same height or thickness can afford the advantage that specific processes during the production of the semiconductor module 100' are easier to implement. By way of example, a leadframe for fixing the components in a molding process could be of a significantly simpler type.

In the power semiconductor module 100', a circuit of a logic/control region can be arranged on the first substrate 102, as described further above. A circuit of a power region can be arranged on the second substrate 116. A voltage of more than 48V can be present at the power region, e.g. a voltage of 100V or more, 500V or more, or else 1 kV or more. Furthermore, the power region can be designed for operation with high currents, e.g. currents of 10 A to 500 A.

The power region can comprise one or more semiconductor chips, e.g. a second semiconductor chip 112 arranged on the second substrate, e.g. on the upper metal layer 116_1. The second semiconductor chip 112, e.g. an electrode of the second semiconductor chip 112 that is arranged on the lower side, can be electrically connected to the upper metal layer 116_1. The second semiconductor chip 112 can be a power semiconductor chip designed e.g. to be operated with the high voltages and/or high currents described above. The second semiconductor chip 112 can be e.g. a semiconductor chip of the IGBT or MOSFET type.

The logic/control region and the power region of the power semiconductor module 100' can be electrically connected to one another, e.g. by means of a connection element 118. The connection element 118 can comprise e.g. a wire, a conductive tape, a metal clip, a redistribution plane, vias or the like. The connection element 118 can be connected e.g. by one end to an electrode at the upper side of the second semiconductor chip 112 or to the upper metal layer 116_1, and by the other end to the conductive layer 106. The power semiconductor module 100' can also comprise a plurality of connection elements 118 connected to different parts of the logic/control region and/or of the power region. The first semiconductor chip 108 can be a control or driver chip for the second (power) semiconductor chip 112.

In accordance with one example, the logic/control region can comprise further electrical or electronic components 120, e.g. further semiconductor chips or resistors or capacitors, etc. The further electrical or electronic components 120 can be arranged on the conductive layer 106 and be electrically connected thereto.

The first substrate 102 can have one or a plurality of first external contacts 122 designed for electrically contacting the first semiconductor chip 108. The first external contact(s) can be designed e.g. for voltages of approximately −15V to 30V. The second substrate 116 can likewise have one or a plurality of second external contacts 124. The second external contact(s) 124 can be power contact(s) of the power semiconductor module 100'.

In accordance with one example, the first substrate 102 has the second (native) aluminum oxide layer 114, as described with regard to the power semiconductor module 100. The second aluminum oxide layer 114 can be arranged next to the first aluminum oxide layer 104. In accordance with one example, the second substrate 116 can also have a second aluminum oxide layer (not shown in FIG. 1B). The latter can be arranged e.g. next to, but not below, the second semiconductor chip 112 and/or second external contact 124.

The second semiconductor chip 112, the second external contact 124 and possible further components of the power region of the power semiconductor module 100' can be fitted to the second substrate 116 in each case by means of a solder connection, a welding connection, a sintering connection or the like. In particular, a connection technology requiring heating to more than 250° C. can be used. The first substrate 102, by contrast, can be equipped by means of such connection technologies that require heating to less than 250° C., as described with regard to FIG. 1A. This makes it possible to prevent the first aluminum oxide layer 104 from being damaged by excessively high temperatures.

Figure 2:
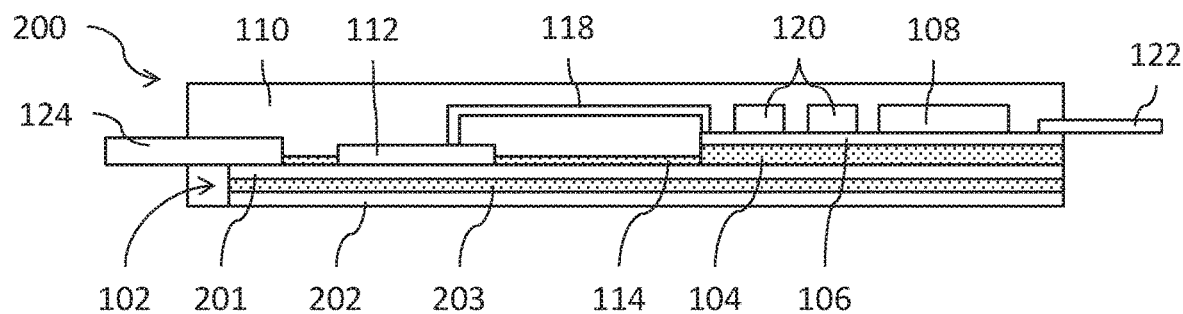
FIG. 2 shows a schematic cross-sectional view of a power semiconductor module comprising a logic/control region and a power region, which are arranged on a common substrate.

FIG. 2 shows a cross-sectional view of a power semiconductor module 200, which can be identical or at least similar to the power semiconductor module 100. The power semiconductor module 200 can comprise all components described with regard to the power semiconductor module 100 and additionally the components described below. The power semiconductor module 200 can differ from the power semiconductor module 100' substantially in that it does not comprise two separate substrates 102, 116, but rather a single, common first substrate 102.

The first substrate 102 of the power semiconductor module 200 can be e.g. of the DAB type and comprise an upper metal layer 201, a lower metal layer 202 and an electrical insulation layer 203 arranged between the metal layers 201, 202. The logic/control region having the first semiconductor chip 108 and the power region having the second semiconductor chip 112 can both be arranged on the first substrate 102. The logic/control region is arranged on the conductive layer 106, which is insulated from the power region (e.g. the second semiconductor chip 112) by the first aluminum oxide layer 104.

In accordance with one example, the first substrate 102 can have the first aluminum oxide layer 104 and the second aluminum oxide layer 114. In accordance with one example, the first aluminum oxide layer 104 can cover the upper metal layer 201 completely, apart from gaps in which components such as the second semiconductor chip 112 or the second external contact 124 are arranged and electrically connected to the upper metal layer 201.

In accordance with one example, exclusively connection technologies for fitting components such as the first and second semiconductor chips 108, 112 to the first substrate which require heating to less than 250° C. can be used in the power semiconductor module 200. These can be e.g. sintering connections. It is thereby possible to avoid damage to the first aluminum oxide layer 104 during the production of the power semiconductor module 200.

Figure 3A:
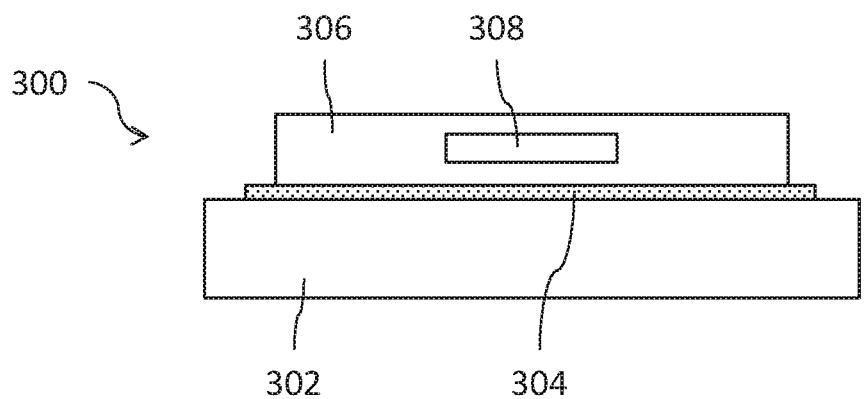
FIGS. 3A and 3B show schematic cross-sectional views of power semiconductor modules comprising an aluminum substrate like a housing or a heat sink.

FIG. 3A shows a cross-sectional view of a power semiconductor module 300 comprising an aluminum substrate 302, an aluminum oxide layer 304 arranged on the aluminum substrate 302, and a printed circuit board 306 arranged above the aluminum oxide layer 304. A power semiconductor chip 308 is embedded into the printed circuit board 306. The aluminum oxide layer 304 is configured to electrically insulate the power semiconductor chip 308 from the aluminum substrate 302.

In accordance with one example, the aluminum substrate 302 is a housing of the power semiconductor module 300 and/or a heat sink configured to dissipate heat generated by the power semiconductor chip 308.

The aluminum oxide layer 304 can be an artificially produced (anodized) layer and it can have a thickness e.g. the same as or similar to that of the first aluminum oxide layer 104 of the power semiconductor modules 100 and 100'. The aluminum oxide layer 304 can wholly or partly cover an upper side of the aluminum substrate 302. In particular, the aluminum oxide layer 304 can completely cover the aluminum substrate 302 below the printed circuit board 306 and it can project beyond a lateral edge of the printed circuit board 306. The aluminum oxide layer 304 can be designed to electrically insulate the aluminum substrate 302 and the printed circuit board 306 from one another up to a voltage difference of 1 kV, or up to a voltage difference of 2 kV or even more.

The printed circuit board 306 can comprise an electrical insulation material, e.g. a polymer or a laminate. The printed circuit board 306 can comprise e.g. a composite material consisting of epoxy resin and glass fiber fabric such as FR-4 for instance. The printed circuit board 306 can comprise an encapsulation body. Furthermore, the printed circuit board 306 can comprise one or a plurality of metallization or redistribution layers, which can be designed to provide electrical connections between individual electrical or electronic components of the power semiconductor module 300.

In accordance with one example, besides the power semiconductor chip 308, further electrical or electronic components can also be embedded into the printed circuit board 306, e.g. further semiconductor chips, capacitors, resistors, etc. In particular, the power semiconductor module 300 can comprise a further semiconductor chip designed to control the power semiconductor chip 308.

The power semiconductor chip 308 can be designed to process the same high voltages and/or high currents as described with regard to the semiconductor chip 112. The power semiconductor chip can be electrically insulated from the aluminum substrate 302 by the aluminum oxide layer 304.

Figure 3B:
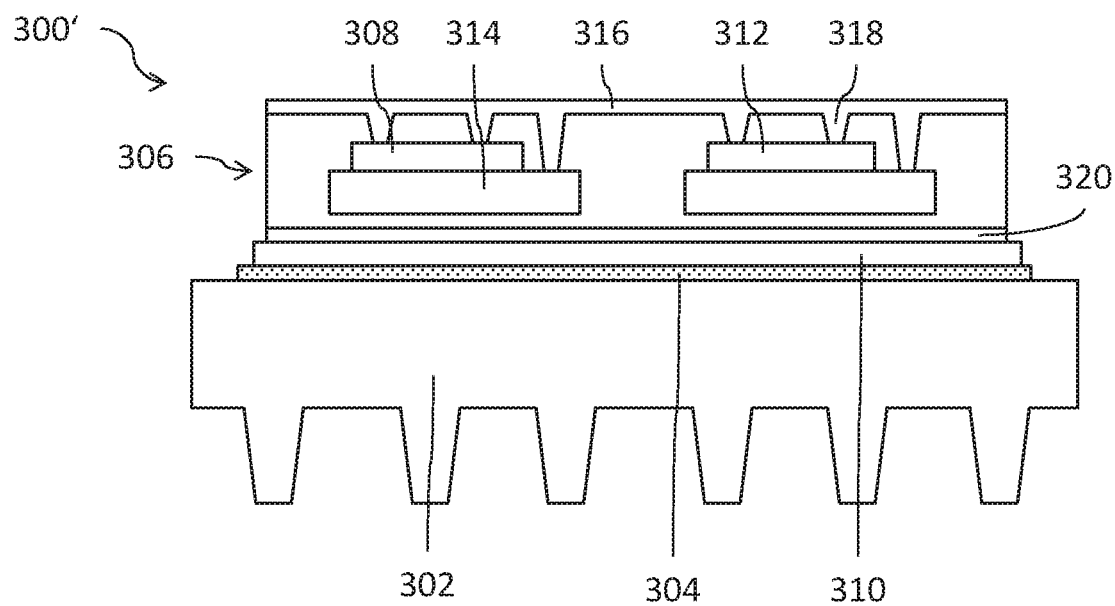

FIG. 3B shows a cross-sectional view of a power semiconductor module 300', which can be identical or at least similar to the power semiconductor module 300. The power semiconductor module 300' can comprise all components described with regard to the power semiconductor module 300 and additionally the components described below.

A layer of a thermally conductive paste 310 can be arranged between the aluminum oxide layer 304 and the printed circuit board 306. The thermally conductive paste 310 can be electrically nonconductive or else electrically conductive. Since an electrical insulation between the aluminum substrate 302 and the printed circuit board 306 is already provided by the aluminum oxide layer 304, it is not necessary to provide such an electrical insulation by means of the layer composed of thermally conductive paste 310. For this reason, an electrically conductive thermally conductive paste 310 can be used in the power semiconductor module 300', which paste can afford the advantage of a lower thermal resistance by comparison with a nonconductive thermally conductive paste. For the same reason, the layer composed of thermally conductive paste 310 can also be particularly thin, optionally also discontinuous, and can serve e.g. only to compensate for unevenness between the printed circuit board 306 and the aluminum oxide layer 304.

The power semiconductor module 300' can comprise the semiconductor chip 308 and also one or a plurality of further semiconductor chips 312. The further semiconductor chip 312 can likewise be a power semiconductor chip and can be e.g. identical to the power semiconductor chip 308. The further semiconductor chip 312 can also be a control chip designed to control the power semiconductor chip 308.

The power semiconductor chip 308 and/or the further semiconductor chip 312 can be arranged in each case on a chip carrier 314. The chip carrier 314 can be e.g. a metal substrate such as, for instance, a copper lamina. The power semiconductor chip 308 and/or the further semiconductor chip 312 can be connected to the chip carrier 314, e.g. by means of a solder connection, a welding connection or a sintering connection. The chip carrier 314 can be designed as a heat spreader for the efficient dissipation of heat generated by the power semiconductor chip 308 and/or the further semiconductor chip 312.

The printed circuit board 306 can comprise an upper metallization layer 316. The upper metallization layer 316 can be designed to provide electrical connections to the power semiconductor chip 308 and possibly to the further semiconductor chip 312. The upper metallization layer 316 can have e.g. structured conductor tracks connected to the power semiconductor chip 308 and/or the further semiconductor chip 312 or the chip carrier 314 by means of vias 318.

The printed circuit board 306 can comprise a lower metallization layer 320. The lower metallization layer 320 can be designed to dissipate heat generated by the semiconductor chips 308, 312 toward the aluminum substrate 302. The lower metallization layer 320 can be electrically connected to the chip carriers 314, e.g. by means of vias (not shown in FIG. 3B).

In accordance with one example, the lower metallization layer 320 can be provided exclusively for this heat dissipation, and have no electrical functionality in the power semiconductor module 300'. The lower metallization layer 320 can be e.g. an unstructured layer (i.e. have no structures such as conductor tracks), which can completely cover the underside of the printed circuit board 306. In accordance with another example, the lower metallization layer 320 can also provide electrical connections, i.e. have an electrical functionality.

Figure 4:
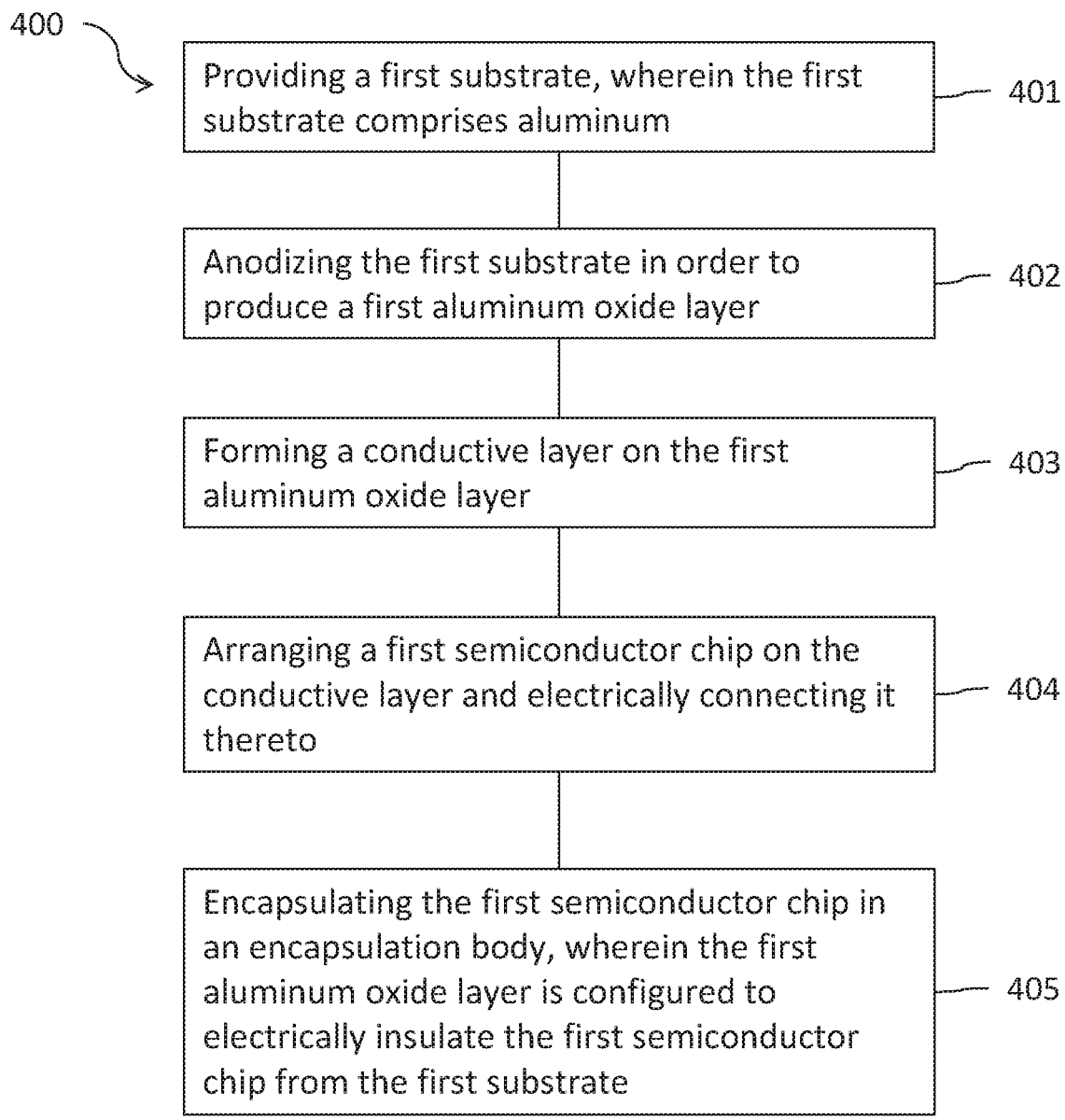
FIG. 4 shows a flow diagram of a method for producing a power semiconductor module.

FIG. 4 shows a flow diagram of a method 400 for producing a power semiconductor module. The method 400 can be used e.g. to produce the power semiconductor modules 100, 100' or 200.

The method 400 comprises at 401 providing a first substrate, wherein the first substrate comprises aluminum, at

402 anodizing the first substrate in order to produce a first aluminum oxide layer, at 403 forming a conductive layer on the first aluminum oxide layer, at 404 arranging a first semiconductor chip on the conductive layer and electrically connecting it thereto, and at 405 encapsulating the first semiconductor chip in an electrical insulation body, wherein the first aluminum oxide layer is configured to electrically insulate the first semiconductor chip from the first substrate.

The method 400 can furthermore comprise structuring the conductive layer in order to produce conductor tracks in the conductive layer.

Anodizing the first substrate can furthermore comprise covering the first substrate with a mask, e.g. a photomask, before the first substrate is anodized. In this way, the first aluminum oxide layer can be produced only on predefined regions of the first substrate.

Figure 5:
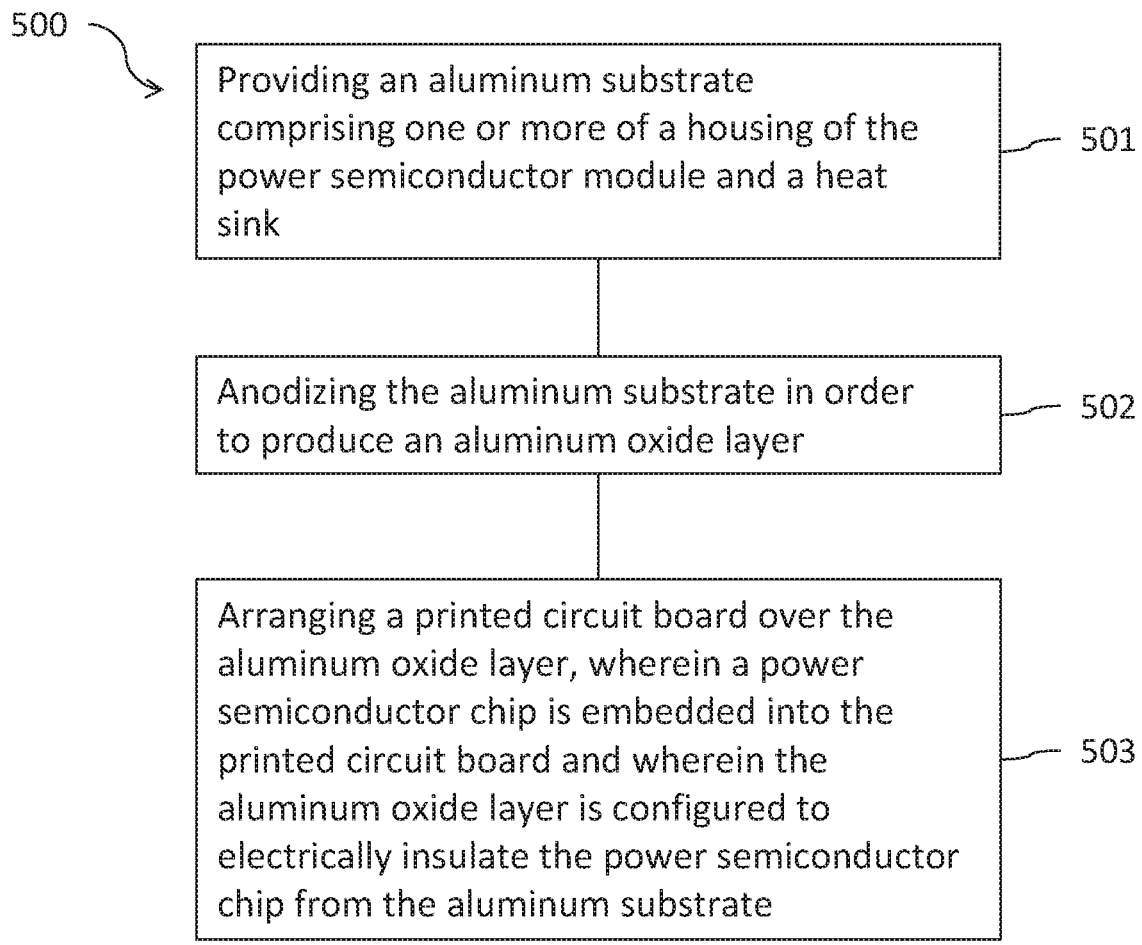
FIG. 5 shows a flow diagram of a method for producing a power semiconductor module comprising an aluminum housing and/or an aluminum heat sink.

FIG. 5 shows a flow diagram of a method 500 for producing a power semiconductor module. The method 500 can be used e.g. to produce the power semiconductor modules 300 or 300'.

The method 500 comprises at 501 providing an aluminum substrate comprising one or more of a housing of the power semiconductor module and a heat sink, at 502 anodizing the aluminum substrate in order to produce an aluminum oxide layer, and at 503 arranging a printed circuit board above the aluminum oxide layer, wherein a power semiconductor chip is embedded into the printed circuit board and wherein the aluminum oxide layer is configured to electrically insulate the power semiconductor chip from the aluminum substrate.

The method 500 can furthermore comprise applying a thermally conductive paste to the aluminum oxide layer, wherein the printed circuit board is arranged on the thermally conductive paste and wherein the thermally conductive paste is electrically conductive.

Figure 6:
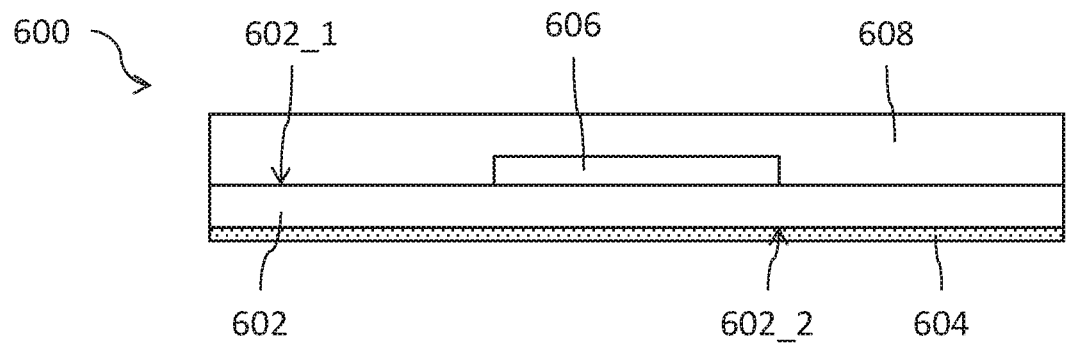
FIG. 6 shows a schematic cross-sectional view of a power semiconductor module in which a substrate is at least partly covered by an oxide layer.

FIG. 6 shows a further power semiconductor module 600. The power semiconductor module 600 can be similar to the power semiconductor modules 100 to 300', apart from the differences described below.

The power semiconductor module 600 comprises a substrate 602, an oxide layer 604, a semiconductor chip 606 and an electrical insulation material 608. In accordance with one example, the substrate 602 can be similar or identical to the first substrate 102, the oxide layer 604 can be similar or identical to the first aluminum oxide layer 104, the semiconductor chip 606 can be similar or identical to the first semiconductor chip 108, and the insulation material 608 can be similar or identical to the insulation material 110.

The substrate 602 of the power semiconductor module 600 is electrically conductive and it has a first side 602_1 and an opposite second side 602_2. The semiconductor chip 608 is arranged on the first side 602_1 of the substrate 602 and the oxide layer 604 is arranged at least on the second side 602_2 of the substrate 602. In particular, the oxide layer 604 can completely cover the second side 602_2.

In accordance with one example, the substrate 602 comprises Cu or completely consists of Cu. The substrate 602 can be e.g. part of a leadframe. The substrate 602 can be a dedicated chip carrier.

The oxide layer 604 can be an aluminum oxide layer and it can be an anodized layer, as described in association with the first aluminum oxide layer 104. In accordance with one example, the oxide layer 604 is configured to electrically insulate the substrate 602 at the second side 602_2. In particular, the oxide layer 604 can be configured to electrically insulate the substrate 602 at an outer area of the power module 600 toward the outside.

The insulation material 608 can be configured to encapsulate the semiconductor chip 606. The insulation material 608 can be e.g. a molded material. It is possible for the oxide layer 604 not to be covered by the insulation material 608. For example, it is possible for the insulation material 608 not to be arranged at the second side 602_2 of the substrate 602.

Figure 7:
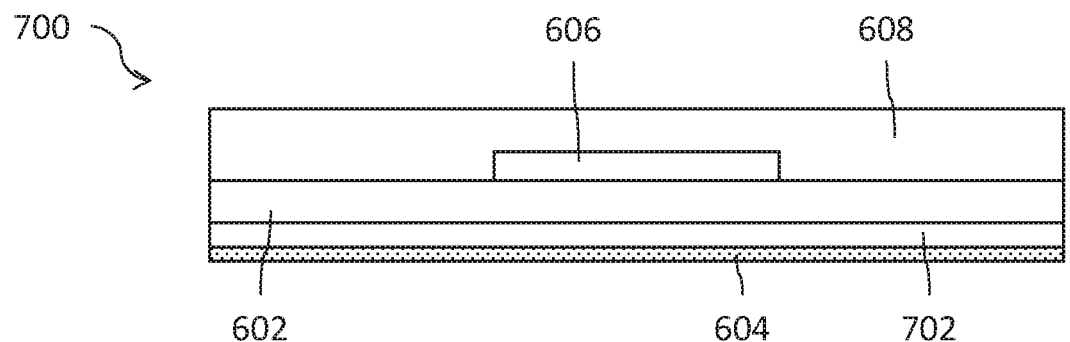
FIG. 7 shows a schematic cross-sectional view of a power semiconductor module in which an additional layer is arranged between the substrate and the oxide layer.

FIG. 7 shows a further power semiconductor module 700. The power semiconductor module 700 can be similar or identical to the power semiconductor module 600 and have only the differences described below.

The power semiconductor module 700 comprises an additional layer 702 arranged between the substrate 602 and the oxide layer 604. The additional layer 702 can comprise or consist of Al, Ti, or Ni, for example. The additional layer 702 can e.g. also comprise or consist of an alloy composed of one or more of said metals.

The substrate 602 can e.g. consist of Cu or comprise Cu and the additional layer 702 can serve to provide a seed layer or adhesion layer for the oxide layer 604. The additional layer 702 can be rolled e.g. onto the substrate 602 (that is to say that the term "layer" need not necessarily denote a grown layer, but rather can e.g. also denote a sheet or a film arranged on the substrate 602).

In accordance with one example, the substrate 602 can have a thickness perpendicular to the first and second sides 602_1, 602_2 that is greater than a thickness of the additional layer 702. However, it is also possible for the thickness of the additional layer 702 to be greater than the thickness of the substrate 602.

Figure 8:
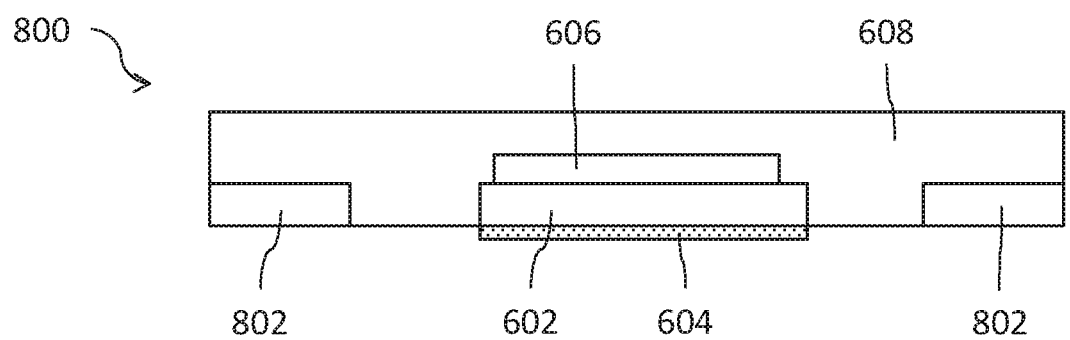
FIG. 8 shows a schematic cross-sectional view of a power semiconductor module having external contacts.

FIG. 8 shows a further power semiconductor module 800. The power semiconductor module 800 can be similar or identical to the power semiconductor modules 600 and/or 700 and have only the differences described below.

The power semiconductor module 800 comprises one or more contacts 802, which can be configured for contacting the semiconductor chip 606 for outside. The contact(s) 802 can be arranged e.g. laterally next to the substrate 602, either in a plane with the substrate 602 or else above or below the plane with the substrate 602.

In accordance with one example, the contact(s) 802 can be part of the same leadframe as the substrate 602. The contact(s) 802 can have the same thickness as the substrate 602 or can have a different thickness, e.g. a smaller thickness.

In accordance with one example, the oxide layer 604 (and if present the additional layer 702) can be arranged only at the substrate 602, but not at the contact(s) 802. It is possible, for example, for the oxide layer 604 (and also the additional layer 702) to be produced only on the substrate 602 during the fabrication of the power semiconductor module 800. However, it is also possible for the oxide layer 604 (and also the additional layer 702) to be produced both on the substrate 602 and on the contact(s) 802 and subsequently to be removed again from the contact(s) 802.

Figure 9:
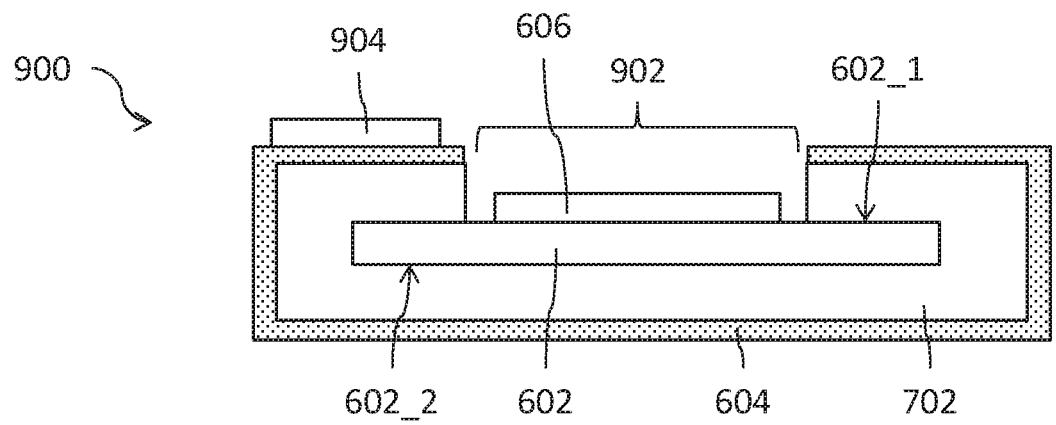
FIG. 9 shows a schematic cross-sectional view of a power semiconductor module in which the oxide layer at least partly covers two opposite sides of a substrate.

FIG. 9 shows a further power semiconductor module 900. The power semiconductor module 900 can be similar or identical to the power semiconductor modules 600 to 800 and have only the differences described below.

In the case of the power semiconductor module 900, the oxide layer 604 is arranged not only at the second side 602_2 of the substrate 602, but also at least in part at the first side 602_1. The additional layer 702 can be arranged (completely) between the substrate 602 and the oxide layer 604 and can likewise be situated at least in part also at the first side 602_1.

The oxide layer 604 and, if present, the additional layer 702 can cover the first side 602_1 of the substrate 602 in such a way that the substrate 602 is exposed in an opening 902 at the oxide layer 604 and/or the additional layer 702. The semiconductor chip 606 can be arranged in the opening 902 and can be electrically connected to the substrate 602.

In accordance with one example, the power semiconductor module 900 can comprise one or a plurality of further semiconductor chip 904. These further semiconductor chips 904 can e.g. be arranged at the first side 602_1 on the oxide layer 604 and thereby be electrically insulated from the substrate 602. The further semiconductor chip(s) 904 can be electrically connected to the semiconductor chip 606 and/or external contacts of the power semiconductor module 900 e.g. by means of bond wires, tapes or clips.

The power semiconductor module 900 can comprise the insulation material 608 (not shown in FIG. 9), which can encapsulate the semiconductor chip 606 and also the further semiconductor chip(s) 904.

Figure 10:
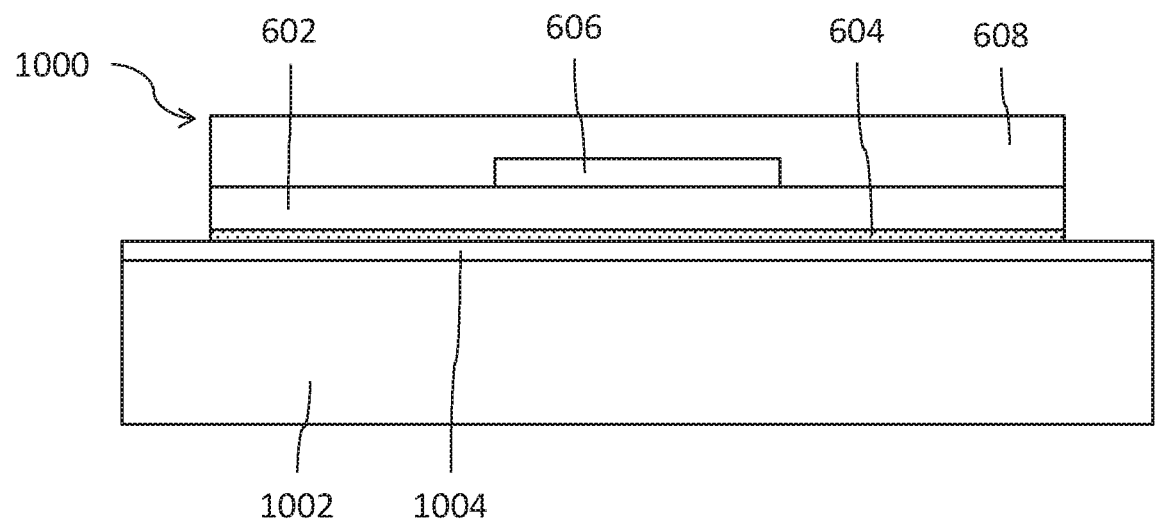
FIG. 10 shows a schematic cross-sectional view of a power semiconductor module having a module carrier.

FIG. 10 shows a further power semiconductor module 1000. The power semiconductor module 1000 can be similar or identical to the power semiconductor modules 600 to 900 and have only the differences described below.

The power semiconductor module 1000 comprises the substrate 602, the oxide layer 604, the semiconductor chip 606, the insulation body 608 and additionally a module carrier 1002, which is arranged at the oxide layer 604. The substrate 602 can be secured to the module carrier 1002 e.g. by mechanical securing means such as, for instance, screws, bolts or clamps or else by means of an adhesive layer. The oxide layer 604 can be configured to electrically insulate the substrate 602 (and thus also the semiconductor chip 606) vis-à-vis the module carrier 1002.

The module carrier 1002 can be e.g. a heat sink configured to dissipate heat generated by the semiconductor chip 606. The heat sink can be designed for air cooling or else for liquid cooling. By way of example, the heat sink can have a channel with a cooling liquid. In accordance with one example, the substrate 602 or the oxide layer 604 can be arranged on an outer surface of the heat sink (as shown in FIG. 10). Such cooling can be referred to as "indirect cooling". In this case, it is possible for a layer of thermally conductive paste 1004 to be arranged on the surface of the heat sink between the oxide layer 604 and the heat sink and to contribute to providing a thermal connection between the substrate 602 and the heat sink.

However, it is also possible for so-called "direct cooling" to be used in the case of the power semiconductor module 1000. That means that the oxide layer 604 is in direct contact with the cooling liquid, that is to say forms part of the inner wall of the channel with the cooling liquid. In this case, the oxide layer 604 can serve, in particular to electrically insulate the substrate 602 from the cooling liquid.

A power semiconductor module and a method for producing a power semiconductor module are explained in further detail below on the basis of examples.

Example 1 is a power semiconductor module, comprising a first substrate, wherein the first substrate comprises aluminum, a first aluminum oxide layer arranged on the first substrate, a conductive layer arranged on the first aluminum oxide layer, a first semiconductor chip, wherein the first semiconductor chip is arranged on the conductive layer and is electrically connected thereto, and an electrical insulation material enclosing the first semiconductor chip, wherein the first aluminum oxide layer is configured to electrically insulate the first semiconductor chip from the first substrate.

Example 2 is a power semiconductor module according to example 1, wherein the first aluminum oxide layer has a thickness of 400 nm or more.

Example 3 is a power semiconductor module according to example 1 or 2, wherein the first aluminum oxide layer is an anodized layer.

Example 4 is a power semiconductor module according to any of the preceding examples, wherein the conductive layer is a structured layer comprising conductor tracks.

Example 5 is a power semiconductor module according to any of the preceding examples, wherein the conductive layer is a layer stack of at least two metal layers.

Example 6 is a power semiconductor module according to any of the preceding examples, wherein the first semiconductor chip is connected to the conductive layer by a sintering connection.

Example 7 is a power semiconductor module according to any of the preceding examples, furthermore comprising a second aluminum oxide layer arranged on the first substrate, wherein a first thickness of the first aluminum oxide layer is greater than a second thickness of the second aluminum oxide layer.

Example 8 is a power semiconductor module according to any of the preceding examples, furthermore comprising a second substrate, wherein the second substrate comprises an electrical insulation layer embedded into an upper and a lower metal layer, wherein a second semiconductor chip is arranged on the second substrate and is electrically connected thereto, and wherein the first and second substrates are electrically insulated from one another by the electrical insulation material.

Example 9 is a power semiconductor module according to example 8, wherein the second semiconductor chip is connected to the second substrate by a solder connection.

Example 10 is a power semiconductor module according to any of the preceding examples, wherein the first substrate comprises an electrical insulation layer embedded into an upper and a lower metal layer, wherein the first aluminum oxide layer and a second semiconductor chip are arranged on the upper metal layer, and wherein the first semiconductor chip is electrically insulated from the upper metal layer by the first aluminum oxide layer.

Example 11 is a power semiconductor module according to example 10, wherein the first semiconductor chip is electrically connected to the conductive layer by a first sintering connection and wherein the second semiconductor chip is electrically connected to the upper metal layer by a second sintering connection.

Example 12 is a power semiconductor module, comprising an aluminum substrate comprising a housing of the power semiconductor module and/or a heat sink, an aluminum oxide layer arranged on the aluminum substrate, and a printed circuit board arranged above the aluminum oxide layer, wherein a power semiconductor chip is embedded into the printed circuit board, and wherein the aluminum oxide layer is configured to electrically insulate the power semiconductor chip from the aluminum substrate.

Example 13 is a power semiconductor module according to example 12, wherein the aluminum oxide layer is an anodized layer.

Example 14 is a power semiconductor module according to example 12 or 13, furthermore comprising a layer of thermally conductive paste arranged between the aluminum oxide layer and the printed circuit board.

Example 15 is a power semiconductor module according to example 14, wherein the thermally conductive paste is electrically conductive.

Example 16 is a method for producing a power semiconductor module, the method comprising providing a first substrate, wherein the first substrate comprises aluminum, anodizing the first substrate in order to produce a first aluminum oxide layer forming a conductive layer on the first aluminum oxide layer, arranging a first semiconductor chip on the conductive layer and electrically connecting it thereto, and encapsulating the first semiconductor chip in an electrical insulation body, wherein the first aluminum oxide layer is configured to electrically insulate the first semiconductor chip from the first substrate.

Example 17 is a method according to example 16, furthermore comprising structuring the conductive layer in order to produce conductor tracks.

Example 18 is a method for producing a power semiconductor module, the method comprising providing an aluminum substrate comprising a housing of the power semiconductor module and/or a heat sink, anodizing the aluminum substrate in order to produce an aluminum oxide layer, and arranging a printed circuit board above the aluminum oxide layer, wherein a power semiconductor chip is embedded into the printed circuit board, and wherein the aluminum oxide layer is configured to electrically insulate the power semiconductor chip from the aluminum substrate.

Example 19 is a method according to example 18, furthermore comprising applying a thermally conductive paste to the aluminum oxide layer, wherein the printed circuit board is arranged on the thermally conductive paste and wherein the thermally conductive paste is electrically conductive.

Example 20 is a device for producing a power semiconductor module, the device comprising means for carrying out a method according to any of examples 16 to 19.

Example 21 is a power semiconductor module, comprising a substrate, wherein the substrate is electrically conductive and has a first side and an opposite second side, a semiconductor chip arranged on the first side of the substrate, wherein the semiconductor chip is electrically connected to the substrate, an electrical insulation material enclosing the semiconductor chip, and an oxide layer arranged at least on the second side of the substrate.

Example 22 is the power semiconductor module according to example 21, furthermore comprising a heat sink arranged at the oxide layer.

Example 23 is the power semiconductor module according to example 22, furthermore comprising a layer of thermally conductive paste arranged between the oxide layer and the heat sink.

Example 24 is the power semiconductor module according to example 22, wherein the oxide layer forms an inner wall of a channel for cooling liquid of the heat sink.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
a first substrate;
a first aluminum oxide layer arranged on the first substrate;
a conductive layer arranged on the first aluminum oxide layer;
a first semiconductor chip arranged on and electrically connected to the conductive layer, the first semiconductor chip being part of a logic or control circuit arranged on the first substrate;
an electrical insulation material enclosing the first semiconductor chip;
a second substrate; and
a second semiconductor chip arranged on and electrically connected to the second substrate, the second semiconductor chip being part of a power circuit arranged on the second substrate,
wherein the first substrate comprises aluminum,
wherein the second substrate comprises an electrical insulation layer embedded into an upper and a lower metal layer,
wherein the first aluminum oxide layer is configured to electrically insulate the first semiconductor chip from the first substrate,
wherein the first substrate and the second substrate are electrically insulated from one another by the electrical insulation material.

2. The power semiconductor module of claim 1, wherein the second semiconductor chip is connected to the second substrate by a solder connection.

3. The power semiconductor module of claim 1, wherein the first substrate comprises an electrical insulation layer embedded into an upper and a lower metal layer, wherein the first aluminum oxide layer and the second semiconductor chip are arranged on the upper metal layer, and wherein the first semiconductor chip is electrically insulated from the upper metal layer by the first aluminum oxide layer.

4. The power semiconductor module of claim 3, wherein the first semiconductor chip is electrically connected to the conductive layer by a first sintering connection, and wherein the second semiconductor chip is electrically connected to the upper metal layer by a second sintering connection.

5. The power semiconductor module of claim 1, wherein the first substrate is an aluminum substrate.

* * * * *